United States Patent [19]
Patel et al.

[11] Patent Number: 5,365,487
[45] Date of Patent: Nov. 15, 1994

[54] DRAM POWER MANAGEMENT WITH SELF-REFRESH

[75] Inventors: Vipul C. Patel, Houston; David R. Brown; Jim C. Tso, both of Sugarland, all of Tex.

[73] Assignee: Texas Instruments Incorporated, Dallas, Tex.

[21] Appl. No.: 857,034

[22] Filed: Mar. 24, 1992

[51] Int. Cl.$^5$ .............................................. G11C 7/00
[52] U.S. Cl. .................................. 365/226; 365/222; 365/227
[58] Field of Search ........... 364/200; 365/222, 189.09, 365/210, 227, 226; 395/275

[56] References Cited

U.S. PATENT DOCUMENTS

| | | | |
|---|---|---|---|
| 4,279,020 | 7/1981 | Christian et al. | 365/226 |
| 4,334,157 | 8/1982 | White, Jr. et al. | 365/222 |
| 4,334,295 | 6/1982 | Nagami | 365/222 |
| 4,653,030 | 3/1987 | Tochibono et al. | 365/222 |
| 4,686,386 | 8/1987 | Tadao | 365/227 |

OTHER PUBLICATIONS

Konishi, Yasuhiro et al., "A 33-ns 4-Mb DRAM with a Battery-Backup (BBU) Mode", IEEE Journal of Solid-State Circuits, vol. 25, No. 5, Oct. 1990, pp. 1112-1116.

"4M Bit Dynamic RAM (Self Refresh, Fast Page & Byte Read/Write Modes)", MOS Integrated Circuit μPD424xxxx, NEC Corporation, 1990.

*Primary Examiner*—Eugene R. LaRoche
*Assistant Examiner*—F. Niranjan
*Attorney, Agent, or Firm*—W. Daniel Swayze; Leo N. Heiting; Richard L. Donaldson

[57] ABSTRACT

A DRAM furnishes power management circuits that remove power from circuits on the DRAM that are not necessary for self-refresh and that turn on and off other circuits necessary for self-refresh in timed relation to the refresh cycle. The power management circuits include a counter and simple decoder circuits that decode the binary output of the counter.

35 Claims, 9 Drawing Sheets

DRAM POWER MANAGEMENT WITH SELF-REFRESH

TECHNICAL FIELD OF THE INVENTION

This invention relates to dynamic random access memory (DRAM) parts, and particularly relates to DRAMs that can be used in personal computers, such as those compatible with the IBM PC, to conserve electrical power.

DESCRIPTION OF THE RELATED ART

Computers typically use DRAMs for their working memory. The working memory furnishes storage of the programs currently available to the processor, storage of data being processed and storage of information displayed to the user. DRAMs fill this need instead of other types of memory devices, such as Static Random Access Memory (SRAM) parts, due to their speed and price value.

DRAMs require however constant refresh of the data bits stored in their cells in order to maintain the stored data. This refresh occurs through action of a memory controller, which is usually combined with another integrated circuit such as the central processor or other application specific chip. The memory controller repetitively addresses or accesses the rows of data bits in the array of each DRAM part at regular intervals. In a 4 megabit DRAM part, 1024 rows normally become accessed every 16 milliseconds.

The refresh occurs in several different ways. A $RAS_{13}$ only refresh uses only the row address strobe (RAS_) in an active low state to address the rows. A CAS_ before RAS_ or CBR refresh places the column address strobe (CAS_) in an active low state before RAS_ goes to a low active state, and then toggles RAS_ for the address of each row to be refreshed.

Personal computers designed to be portable present particular requirements for conserving electrical power. Since they draw power from relatively heavy batteries, reducing the amount of electrical power needed to operate the machine means reduced battery size and weight. This leads to a more desirable product.

In normal operation when turned OFF, the personal computer saves the data from the DRAM working memory by writing it onto the hard or soft disk. If the data is not saved back to disk, it becomes lost when power is removed from the DRAMs. When the personal computer later is turned back ON, the saved data must be read from the disk back to the DRAM working memory to resume processing. This normal operation of saving data to disk and retrieving it to resume processing uses a relatively large amount of electrical power due to the operation of the mechanical disk drives.

One way to reduce the required electrical power occurs by placing the personal computer in a so called sleep mode by active, idle or automatic entry. In this mode, the personal computer maintains the data in the DRAMs and maintains electrical power to the DRAMs. Refresh occurs by the DRAMs entering an internal, self-refresh mode with refresh occurring at a slower rate, which reduces the power used by the DRAMs This saves the electrical power needed to operate the disk drives, but costs the power needed to maintain the data in the DRAMs for possibly extended periods.

An article by Y. Konishi and others, "A 38-ns 4 Mb DRAM with a Battery-Backup (BBU) Mode," IEEE Journal of Solid-State Circuits, Vol. 25, No. 5, October, 1990, describes a BBU mode that provides automatic data retention with extremely reduced power consumption. Automatic data retention occurs from internally generated refresh of the DRAM. The extremely reduced power consumption results from minimizing the refresh current and the back-bias generator current.

The disclosed DRAM enters the BBU mode by receiving a CAS before RAS (CBR) refresh indication, with CAS_ low for over 16 milliseconds without a RAS_ refresh cycle. The BBU mode continues as long as the CAS_ is low regardless of the RAS_level. Row refresh in the BBU mode occurs through use of the internal refresh address counter also used in the CBR refresh mode.

The BBU mode reduces the refresh current by activating only one of four array drivers, the word-line drivers, at one cycle instead of the four array drivers that are normally activated at one cycle. Each array driver, also described as a peripheral circuit, is activated in turn every four cycles. In effect, the turnaround refresh cycle of the BBU mode is four times more and the average refresh cycle is four times longer than that of a standard refresh cycle. This cuts the array and array driver current at one cycle of the BBU mode to about one fourth of the current used in a conventional CBR mode.

The BBU mode reduces the back bias generator current by reducing its duty ratio to about one eighth of the normal mode. The back bias generator works during the reset and sensing operation, which is determined by the refresh request signal.

The data sheet for an NEC uPD424xxxx memory part indicates a CBR self-refresh cycle that appears to be similar to the BBU mode disclosed in the cited paper.

SUMMARY OF THE INVENTION

The present invention achieves reduced power consumption in DRAM parts during a sleep mode effected in the associated computer system through the use of power management circuits. These power management circuits reduce the power in first circuits needed for the DRAM parts to effect an internal or self-refresh of the contained data and reduce or eliminate the power consumed by other or second circuits in the DRAM parts during self-refresh.

The power management circuits in the DRAM parts recognize signals in the personal computer indicating a sleep mode, which are typically the CBR refresh signals with no RAS_ cycle for about 10 microseconds. Immediately upon recognition of the sleep mode signals, the power management circuits reduce the frequency of the on-chip oscillator and remove electrical power from several of the internal circuits of the DRAM. These internal circuits can include the column data paths, the over-voltage detector and the Vbb detector.

A certain period after recognizing the sleep mode signals, typically 100 microseconds, the power management circuits implement a special self-refresh process that turns certain refresh supporting circuits on and off before and after each row refresh. These refresh supporting circuits can include the dummy cell reference voltage generator, the bit line reference voltage generator and the Vbb pump.

The power management circuits of the invention achieve these features by simple counter and decoder circuits. A counter and associated decoder circuits operate to recognize the sleep mode indication from the central processor and produce certain power management control signals to remove power from the desired circuits. Other associated decoder circuits produce other power management control signals to control the refresh of data and the turning on and off of the refresh supporting circuits.

Alternatively, two separate counters could be used. Further, this power management scheme also works well with computers powered from normal power lines, and is not limited to battery powered applications.

DESCRIPTION OF THE PREFERRED EMBODIMENT

Figure 1:
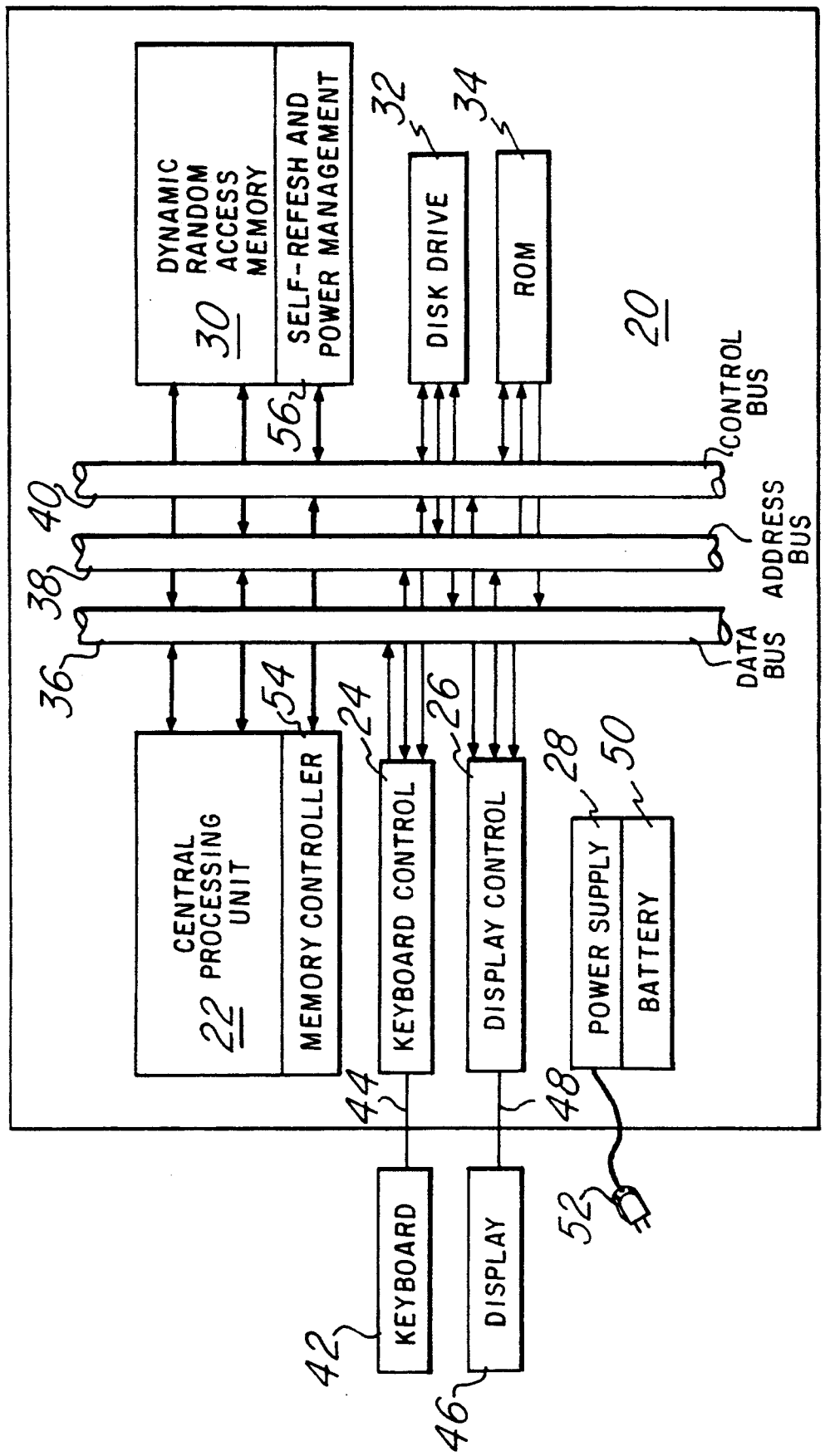
FIG. 1 depicts a block diagram of a computer system arranged for use as a personal computer.

In FIG. 1, computer system 20 furnishes central processing unit 22, keyboard control 24, display control 26, power supply 28, dynamic random access memory (DRAM) 30, disk drive 32 and ROM 34. These different parts connect together through data bus 36, address bus 38 and control bus 40. Keyboard control 24 connects to keyboard 42 over leads 44 and display control 26 connects to display 46 over leads 48. Power supply 28 includes provisions for battery 50 and can connect to line power through plug 52.

Central processing unit 22 includes memory controller 54. DRAM 30 includes self-refresh and power management circuits 56.

Figure 2:
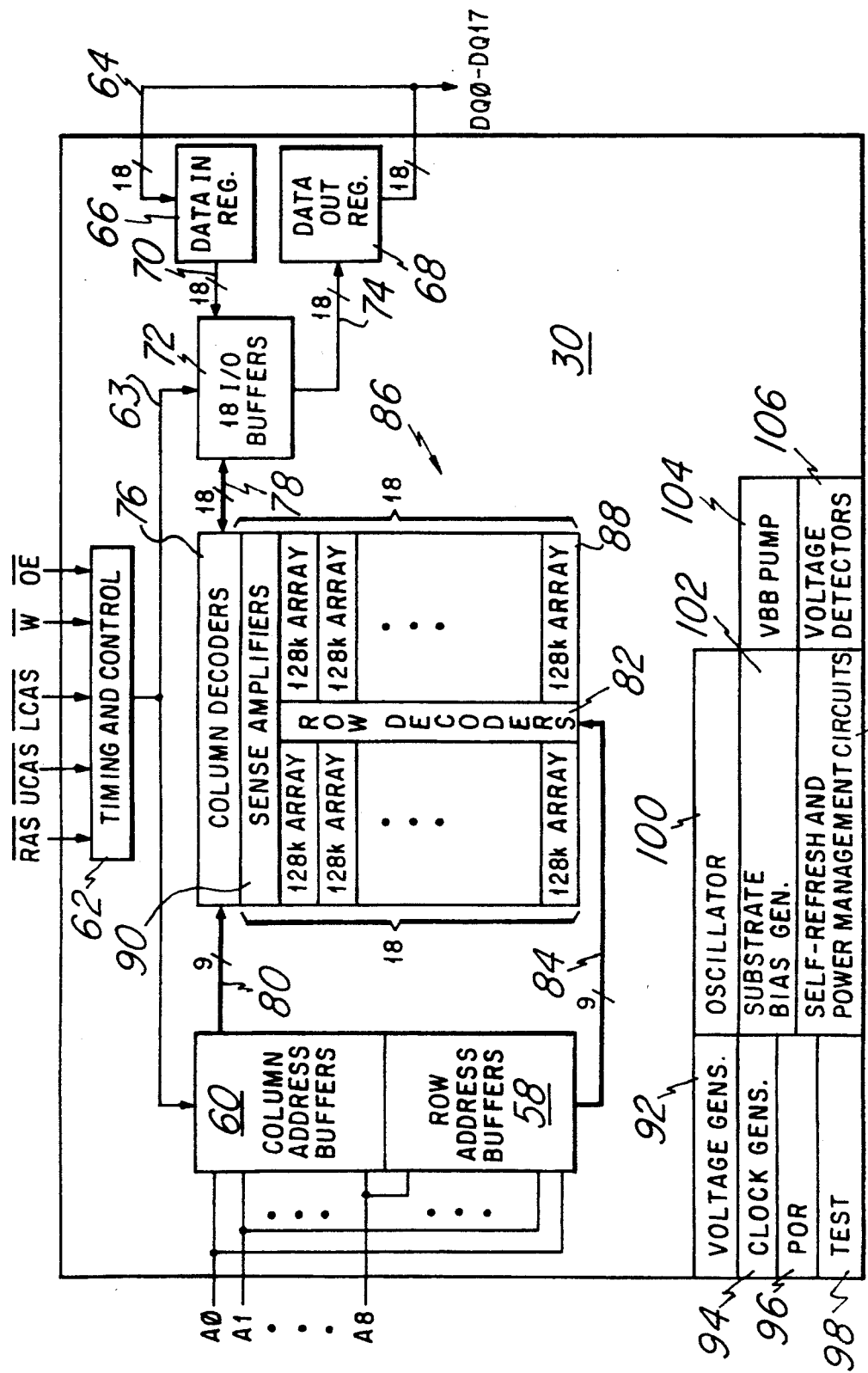
FIG. 2 depicts a block diagram of the internal circuits of a DRAM including the power management circuits of the invention.

In FIG. 2, DRAM 30 receives address signals A0–A8 in ROW address buffers 58 and column address buffers 60. The address signals become latched in the address buffers by use of control signals ROW address strobe (active low, RAS_), upper column address strobe (active low, UCAS_) and lower column address strobe (active low, LCAS_) received in timing and control block 62. Leads 63 carry desired timing and control signals from block 62 to buffers 58 and 60.

Data signals DQ0–DQ17 are carried in parallel on leads 64 to data in register 66 and data out register 68. Eighteen data signals in parallel pass across leads 70 from data in register 66 to the 18 I/O buffers 72 and 18 data signals in parallel pass across data leads 74 from the 18 I/O buffers 72 to the data out register 68. Eighteen data signals in parallel pass from the I/O buffers 72 to the column decoders 76 across leads 78. The I/O buffers 72 also receive timing and control signals over leads 63 from timing and control block 62. Column decoders 76 receive 9 address signals in parallel across leads 80 from column address buffers 60. ROW decoders 82 receive 9 address signals in parallel over leads 84 from ROW address buffers 58. Column decoders 76 and ROW decoders 82 address individual memory cells in overall array 86, which includes 4,718,592 data bits configured in 262,144 (256K) words by 18 bits per word. Overall array 86 contains 36 array parts such as array part 88 with each array part containing 128K of data bits. Eighteen array parts are located on either side of ROW decoders 82. The data signals from the selected rows of data bits in the array parts pass through sense amplifiers 90 to column decoders 76.

Control signals write (active low, W_) and output enable (active low, OE_) connect to timing and control block 62 to indicate and control the writing and reading of data signals from overall array 86.

Please understand that this text uses an underline character following the acronym for a signal to indicate the active low state. This facilitates preparation using a word processor, even though the drawing may use an overscore to indicate the active low state.

DRAM 30 also includes additional supporting circuits required for proper operation. These include but are not limited to voltage generators 92, clock generators 94, power on reset circuits 96, test circuits 98, oscillator circuits 100, substrate bias generators 102, Vbb pump circuits 104, voltage detectors 106 and the self-refresh and power management circuits 56 of the invention.

Figure 3:
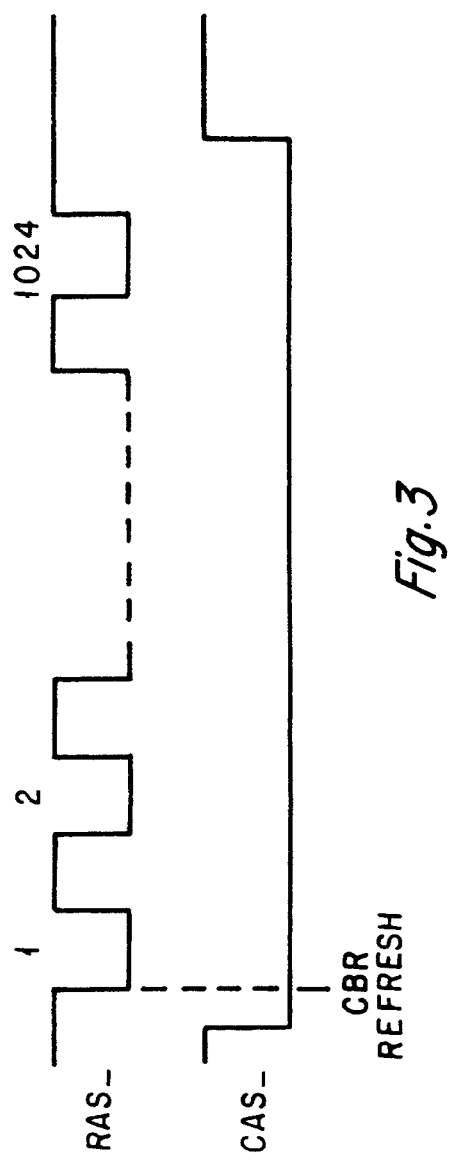
FIG. 3 depicts a timing diagram of a normal CAS_ before RAS_ (CBR) refresh sequence.

In FIG. 3, CBR or CAS_ before RAS_ refresh occurs with CAS_ going active low before RAS_ goes active low for the first time. CAS remains active low while RAS_ toggles between active low and inactive high to address 1,024 sequential rows. In This refresh mode, the external address is ignored and the refresh address is generated internally. FIG. 3 depicts that CAS before RAS refresh begins with RAS going to an active low with an active low CAS_.

Figure 4:
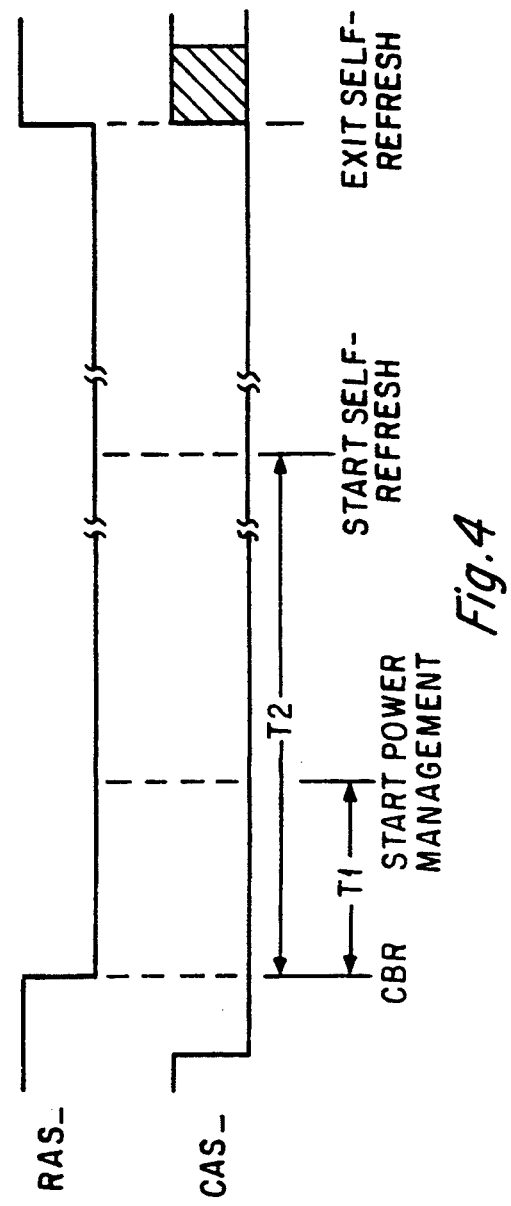
FIG. 4 depicts a timing diagram of signals indicating a sleep mode used with the invention.

In FIG. 4, CBR refresh begins in its usual manner but the signal RAS_ remains in an active low state. At time T1 after the beginning of CBR refresh, the power management features of the invention begin. Time T1 is 10 microseconds and is set to be longer than 1 cycle of signal RAS_ in the CBR refresh mode. The features of the invention start self-refresh of the overall memory array at a time T2 after the beginning of CBR refresh. Typically time T2 is 100 microseconds. The features of the present invention exit the power management and self-refresh cycles or modes of operation upon the signal RAS_ going to an inactive high state.

Figure 5:
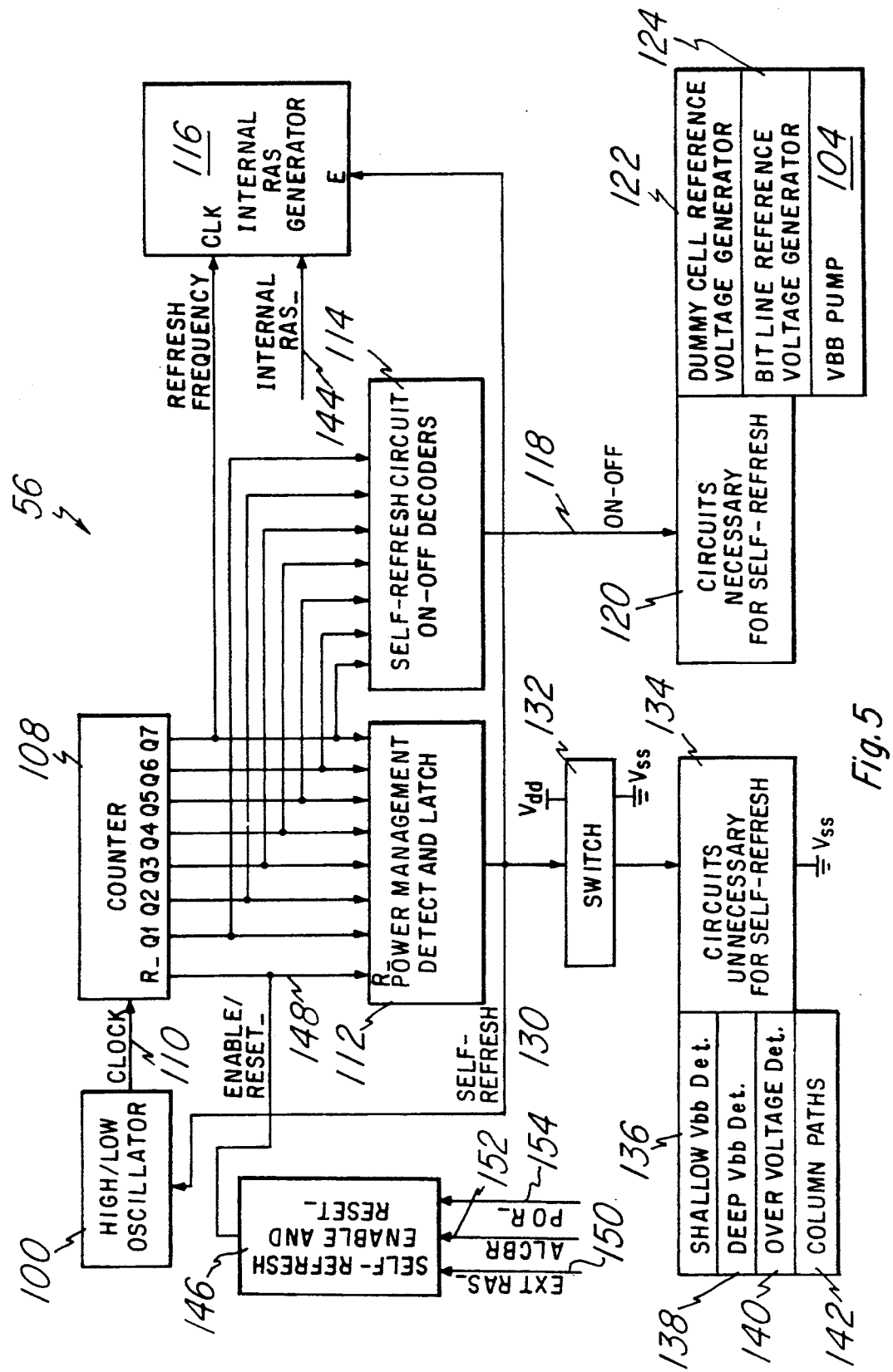
FIG. 5 depicts a block diagram of the power management circuits of the invention.

In FIG. 5, power management circuits 56 include counter 108 receiving a clock signal on lead 110 from high/low oscillator 100 and produces a binary count on outputs Q1–Q7. Power management detect and latch 112 and self-refresh circuits on-off decoders 114 both receive the binary counts Q1–Q7. Binary count Q7 also serves as the signal refresh frequency and the input clock to internal RAS generator 116.

Self-refresh circuits on-off decoders 114 produces an on-off signal on lead 118 to the circuits necessary for self-refresh 120, or first circuits. These circuits include dummy cell reference voltage generator 122, bit line reference voltage generator 124 and Vbb pump 104. Power manager detect and latch circuits 112 produce a self-refresh signal on lead 130 to switch 132, internal RAS generator 116 and the high/low oscillator 100. Switch 132 controls the application of Vdd or Vss to the circuits unnecessary for self-refresh 134, or second circuits. The circuits unnecessary for self-refresh 134 include a shallow Vbb detector 136, a deep Vbb detector 138, an overvoltage detector 140 and the column paths 142 in the overall array.

The internal RAS_ generator 116 produces an internal RAS_signal on lead 144. This internal RAS_ effects the ROW line driving at each refresh cycle.

A self-refresh enable and reset_ circuit 146 produces an enable/reset_ signal on leads 148 in response to receiving the signals external RAS_ on lead 150, RLCBR on lead 152 and the power on reset signal POR_ on lead 154. The enable/reset_signal, in a low state, on lead 148 resets the counter 108 and the power management detect and latch circuits 112 and, in a high state, enables their operation.

The self-refresh signal on lead 130 causes oscillator 100 to produce clock signals at a low frequency during this self-refresh indication.

Figure 6:
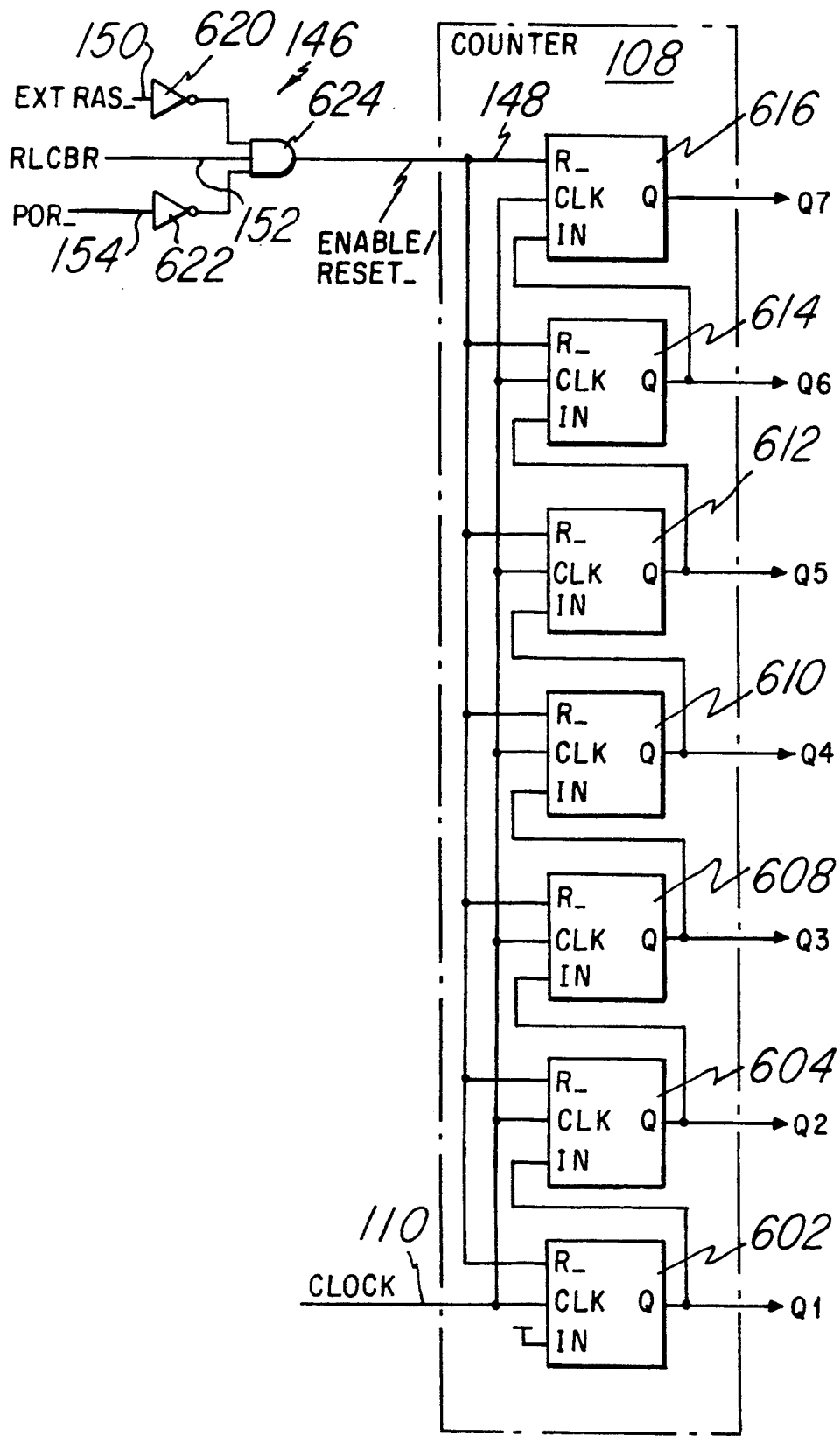
FIG. 6 depicts a circuits diagram of a self-refresh counter used with the invention.

In FIG. 6, counter 108 furnishes 7 flip-flops 602–616. The input of flip-flop 602 is tied to Vdd while the inputs of the succeeding flip-flops each are tied to the output of the preceding flip-flop. Clock 110 connects to the clock input of each flip-flop and the enable/reset_ signal on lead 148 connects to all of the reset inputs. In this embodiment the self-refresh enable and reset_ circuits 146 furnish 2 inverters 620 and 622 and an AND gate 624.

Figure 7:
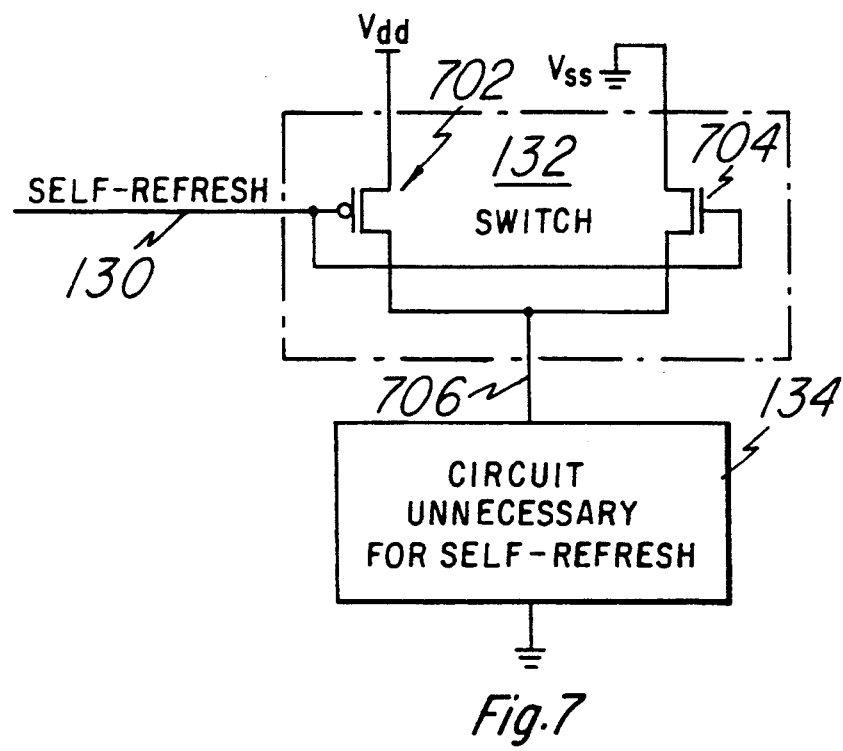
FIG. 7 depicts a circuit used to remove power from certain circuits that is used with the invention.

In FIG. 7, switch 132 receives the self-refresh signal on lead 130 and applies it to the gates of P channel transistor 702 and N channel transistor 704. Transistors 702 and 704 are MOS field effect transistors in which the drains and sources can be described as interchangeable. Transistor 702 has one its source/drain connected to Vdd with the other side connected to the circuits unnecessary for self-refresh through leads 706. Transistor has one of its source/drain connected to Vss with the other of the source/drain also connected to the circuit unnecessary for self-refresh 134 through leads 706. The other side of the circuits unnecessary for self-refresh 134 connects to Vss through lead 707. In this way, switch 132 completely removes the application of power to the circuits unnecessary for self-refresh 134 so that no power can be used in these circuits. In particular the circuits that are not necessary or unnecessary for self-refresh include the shallow Vbb detector 136, the deep Vbb detector 138, the overvoltage detector 140 and the column paths 142.

Figure 8:
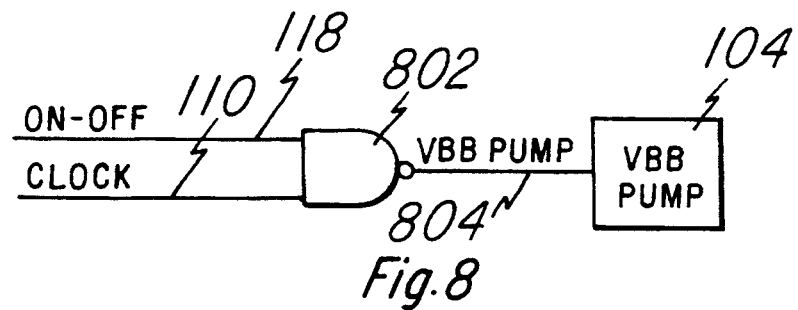
FIG. 8 depicts a block diagram of the circuits used to turn a Vbb pump on and off in the present invention.

In FIG. 8, the signal on-off on lead 118 and the clock signal 110 are applied to NAND gate 802 to produce a Vbb Pump signal on lead 804 to the Vbb pump 104. This controls operation of the Vbb pump from operation of the signal on-off and the clock signal.

Figure 9:
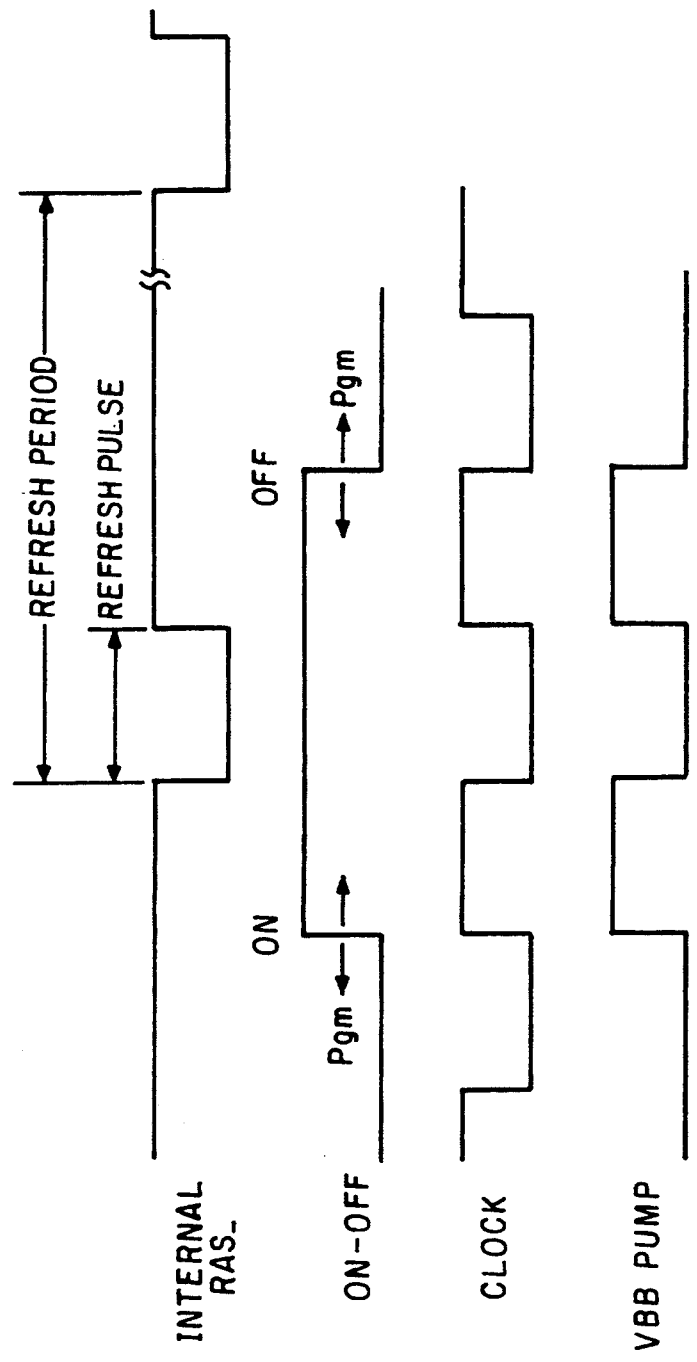
FIG. 9 depicts a timing diagram of the signals used to effect self-refresh of data in a DRAM using the present invention with the turning on and turning off of the Vbb pump circuits.

In FIG. 9, the signal Internal RAS_ produces refresh pulses every refresh period. Registered in time with the refresh pulses, the on-off signal produces an active high signal that turns on and off at separately programmable times relative to the refresh pulse respectively going low and going high. Because the internal RAS_ generator produces the internal RAS_signal in sequence with the binary count from binary count signal Q7, the on-off signal can be registered with the refresh pulse. By changing the decoding in self-refresh circuits on-off decoders 114, the on and off edges can be programmed as desired. The clock signal also occurs in timed sequence with the refresh pulse, and with the Vbb Pump signal being a combination of the on-off signal and the clock signal, the Vbb pump signal indicates an active pump before and after the refresh pulse determined by the signal Internal RAS_. The Vbb pump signal indicates an inactive pump during the refresh signal. This causes the Vbb pump to operate once before and once after the refresh of a row of data cells. If desired, suitable gating can activate the Vbb pump more than once before and more than once after a refresh pulse.

Figure 10:
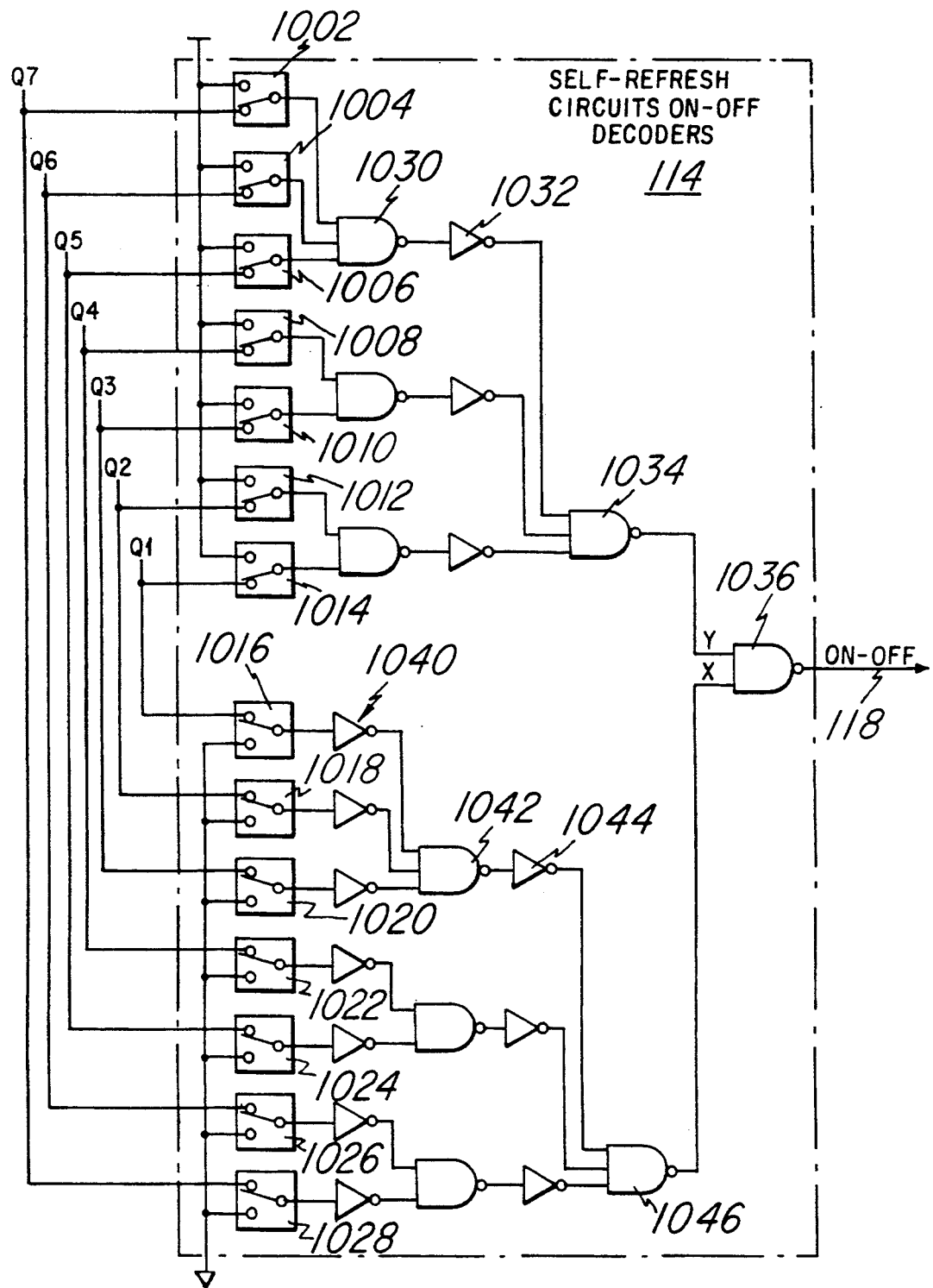
FIG. 10 depicts a circuit diagram of the on-off decode circuits used to effect self-refresh in the present invention.

In FIG. 10, self-refresh circuits on-off decoders 114 receives the binary counts of signals Q1–Q7 and produces the on-off signal on lead 118. Switches 1002 through 1014 connect to the binary signals Q7–Q1 respectively and Vdd. Switches 1016–1028 connect to the binary signals Q1–Q7 respectively and Vss. Switches 1002–1028 can be formed as desired on the integrated circuit of the DRAM 30 and preferably are formed by fuses or fusible links. Antifuses also could be used. The connection of the leads to Vdd, Vss or the binary counts Q1–Q7 determine the selected timing of the on-off signal 118. The outputs from switches 1002–1014 pass through NAND gates 1030, inverters 1032 and NAND gate 1034 to form the Y input of NAND gate 1036. The outputs of switches 1016–1028 pass through inverters 1040, NAND gates 1042, inverters 1044 and NAND gate 1046 to form the X input to inverter 1036.

Figure 11:
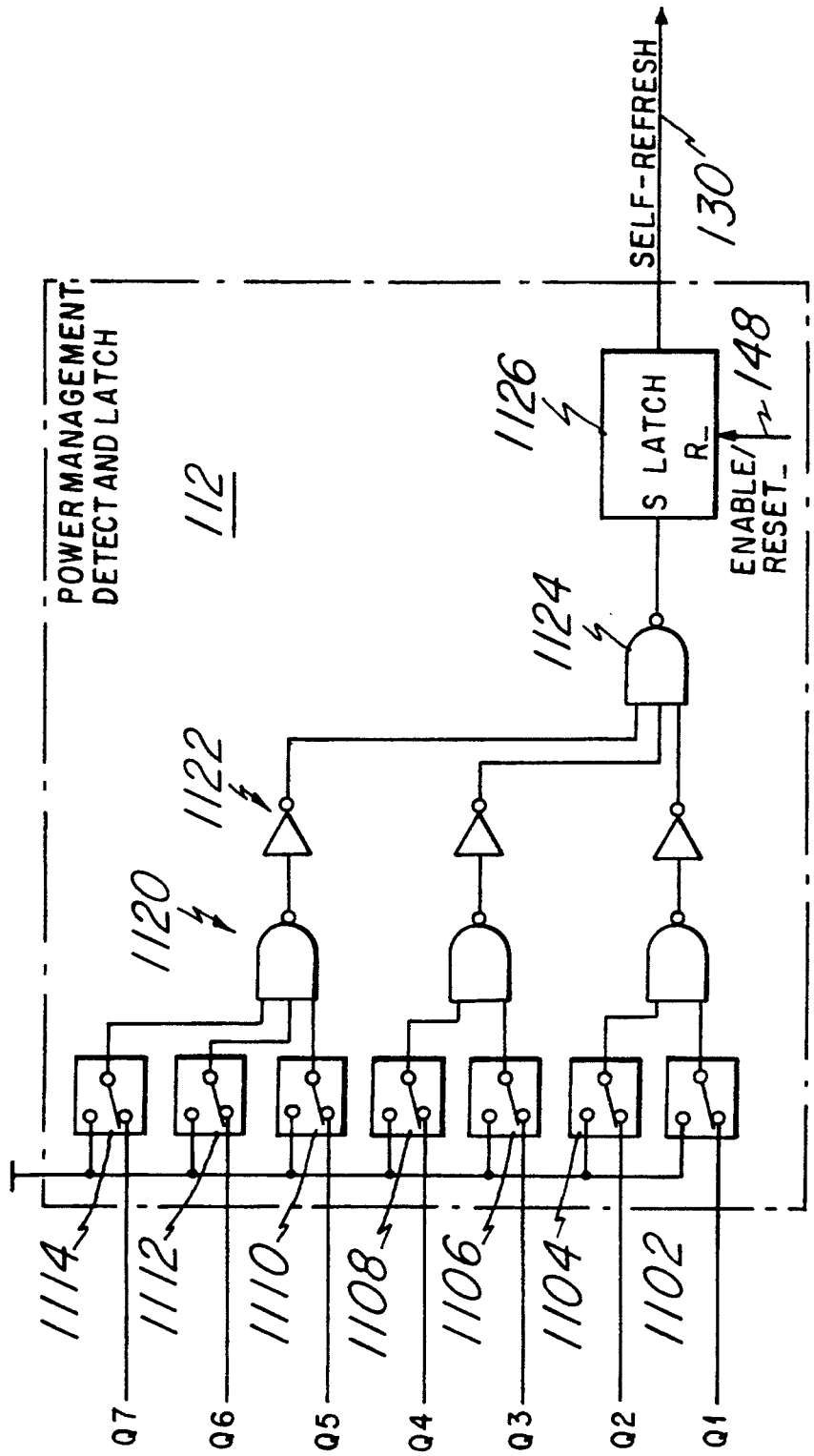
FIG. 11 depicts a circuit diagram of the power management detect and latch circuits of the present invention.

In FIG. 11, power management detect and latch circuit 112 receives the binary counts Q1–Q7 to produce the self-refresh signal on lead 130. Circuits 112 include switches 1102–1114 respectively connected to the binary counts Q1–Q7. Switches 1102–1114 also can be formed as fusible links or antifuses in the semiconductor material of DRAM 30. They each also connect to Vdd. The outputs of switches 1102 pass through NAND gates 1120, inverters 1122 and NAND gate 1124 to form the set input to latch 1126. The enable/reset_ signal on lead 148 supplies the reset_ input to latch 1126. The output of latch 1126 forms the self-refresh signal on lead 130.

The disclosed invention thus furnishes a process of maintaining data in a personal computer when or while the personal enters or is placed in a sleep mode. This obviates the need to save the data on a disk. The process comprises receiving a user indication of a sleep mode; this can be an affirmative action on the part of the user to push a button or switch or can be a passive action of no use of the portable personal computer for a length of time. The personal computer then retains any stored data in the dynamic random access memory parts of the personal computer during the sleep mode. This is instead of moving the data to disk.

Internally, the personal computer, usually the memory controller, produces signals to the dynamic random access memory parts indicating that the sleep mode is to be effected. In response to the sleep mode signals, the dynamic random access memory parts effect a self-refresh of the dynamic memory cells that is internally controlled by operation of power management circuits.

The self-refresh occurs at a rate reduced from a normal refresh rate by the power management circuits reducing the frequency of an internal oscillator. The power management circuits also operate first circuits, which are required to operate to effect the self-refresh, substantially only at the refresh of a row of memory cells. The power management circuits also remove normally applied electrical power from second circuits in the dynamic random access memory parts; the second circuits do not need to operate and can have power removed during the refresh of row of memory cells.

The described invention can be practiced in ways different than those specifically disclosed. For example, different counting and decoding schemes can be implemented to reduce the frequency of the on-chip oscillator and remove electrical power from several of the internal circuits of the DRAM that are not necessary for self-refresh. Alternative embodiments can also implement in other ways the special self-refresh process that turns certain refresh supporting circuits on and off before and after each ROW refresh. Also, the times of 10 and 100 microseconds can be varied as desired to meet the requirements of different implementations.

Additionally the invention has been explained in connection with a DRAM having a memory array of 4M bits configured to furnish 256K by 18 data bits. The claimed invention can also be used with arrays of other sizes and configurations while remaining within the scope of the claims.

We claim:

1. A computer system comprising:
    a central processor that performs the processing of the computer system;
    a memory including the data to be processed by the processor and the instructions to be used in the central processor for processing the data;
    a memory controller associated with the central processor for controlling access of the memory by the central processor, said memory controller producing signals indicating a sleep mode to the memory; and
    the memory including dynamic random access memory parts including arrays of memory cells, the cells being dynamic and requiting refresh of groups of cells at a certain rate to maintain data stored in the cells, the dynamic random access memory parts further including first circuits required to operate to support refresh of the memory cells and second circuits that can have power removed during refresh of the memory cells, the dynamic random access memory parts further including power management circuits that operate in response to the signals indicating a sleep mode to effect a self-refresh of the memory cells with operation of the first circuits substantially only at refresh of a group of cells and with electrical power removed from the second circuits.

2. The computer system of claim 1, wherein said group of cells is a row of cells.

3. The computer system of claim 1, wherein said first circuits include dummy cell reference voltage generator circuits.

4. The computer system of claim 1, wherein said first circuits include bit line reference voltage generator circuits.

5. The computer system of claim 1, wherein said first circuits include Vbb pump circuits.

6. The computer system of claim 1, wherein said second circuits include shallow Vbb detector circuits.

7. The computer system of claim 1, wherein said second circuits include deep Vbb detector circuits.

8. The computer system of claim 1, wherein said second circuits include overvoltage detector circuits.

9. The computer system of claim 1, wherein said second circuits include column path circuits.

10. The computer system of claim 1, wherein said power management circuits include a binary counter producing binary signals, first and second decoder circuits both decoding the binary signals and each producing a respective output signal, and a dual frequency oscillator producing a clock signal applied to the binary counter and receiving the output of the second decoder circuits to indicate one of the dual frequencies, the output of the first decoder circuits controlling the first circuits and the output of the second decoder circuits controlling the second circuits.

11. The computer system of claim 1, wherein the power management circuits remove power from the second circuits about ten microseconds after recognizing a CBR refresh with an absence of RAS_ in an active state.

12. The computer system of claim 1, wherein the power management circuits operate the first circuits to support refresh of the memory cells about one hundred microseconds after recognizing a CBR refresh with an absence of RAS_ in an active state.

13. The computer system of claim 1, wherein the power management circuits cause production of an internal refresh pulse for refreshing the group of memory cells and the power management circuits produce Vbb pump signals once before and once after the internal refresh pulse.

14. The computer system of claim 1, wherein the power management circuits cause production of an internal refresh pulse for refreshing the group of memory cells and the power management circuits operating the first circuits selectably before and selectably after the internal refresh pulse to refresh of a group of cells.

15. The computer system of claim 1, wherein the second circuits are connected between Vdd and Vss supply leads and the power management circuits include a switch circuit for each of the second circuits switching the Vdd connection to another Vss supply lead to remove power from each of the second circuit.

16. The computer system of claim 1, wherein the computer system includes keyboard control circuits, display control circuits, disk drive circuits and ROM circuits connected to the central processing unit and memory circuits.

17. A dynamic random access memory part furnishing a self-refresh mode, the part comprising:
    an overall array of dynamic memory cells needing refresh to maintain stored data and configured in subarrays of cells connected together in rows and columns;
    first circuits coupled to the overall array of dynamic memory cells required to operate to support refresh of the dynamic memory cells;
    second circuits coupled to the overall array of dynamic memory cells and that can have power removed during refresh of the memory cells; and
    power management circuits connected to the first and second circuits to effect a self-refresh of the dynamic memory cells with operation of the first circuits substantially only at refresh of a row of cells and with electrical power removed from the second circuits.

18. The dynamic random access memory part of claim 17, wherein said first circuits include dummy cell reference voltage generator circuits.

19. The dynamic random access memory part of claim 17, wherein said first circuits include bit line reference voltage generator circuits.

20. The dynamic random access memory part of claim 17, wherein said first circuits include Vbb pump circuits.

21. The dynamic random access memory part of claim 17, wherein said second circuits include shallow Vbb detector circuits.

22. The dynamic random access memory part of claim 17, wherein said second circuits include deep Vbb detecter circuits.

23. The dynamic random access memory part of claim 17, wherein said second circuits include overvoltage detector circuits.

24. The dynamic random access memory part of claim 17, wherein said second circuits include column path circuits.

25. The dynamic random access memory part of claim 17, wherein said power management circuits include a binary counter producing binary signals, first and second decoder circuits both decoding the binary signals and each of said first and second decoder circuits producing a respective output signal, and a dual frequency oscillator producing a clock signal applied to the binary counter and receiving the output of the second decoder signal circuits to indicate one of the dual frequencies, the output of the first decoder circuits controlling the first circuits and the output of the second decoder circuits controlling the second circuits.

26. The dynamic random access memory part of claim 17, wherein the power management circuits remove power from the second circuits about ten microseconds after recognizing a CBR refresh applied to the part with an absence of RAS_ in an active state.

27. The dynamic random access memory part of claim 17, wherein the power management circuits operate the first circuits to support refresh of the memory cells about one hundred microseconds after recognizing a CBR refresh applied to the part with an absence of RAS_ in an active state.

28. The dynamic random access memory part of claim 17, wherein the power management circuits cause production of an internal refresh pulse for refreshing the row of memory cells and the power management circuits produce Vbb pump signals once before and once after the internal refresh pulse.

29. The dynamic random access memory part of claim 17, wherein the power management circuits cause production of an internal refresh pulse for refreshing the row of memory cells and the power management circuits operating the first circuits selectably before and selectably after the internal refresh pulse to refresh of a group of cells.

30. The dynamic random access memory part of claim 17, wherein the second circuits are connected between Vdd and Vss supply leads and the power management circuits include a switch circuit for each of the second circuits that switches the Vdd connection to another Vss supply lead to remove power from each of the second circuits.

31. A process of maintaining data in a personal computer, the process comprising:
receiving a user indication of a sleep mode;
retaining data in dynamic random access memory pans in the personal computer during the sleep mode;
producing signals to the dynamic random access memory parts indicating the sleep mode is to be effected;
effecting, in response to the producing signals to the dynamic random access memory parts indicating the sleep mode is to be effected, self-refresh of dynamic memory cells in the dynamic random access memory pans, the effecting including reducing the self-refresh rate from a normal refresh rate and operating first circuits that are required to operate to effect the self-refresh substantially only at refresh of a row of memory cells; and
removing, in response to the producing signals to the dynamic random access memory parts indicating the sleep mode is to be effected, electrical power that is normally applied to second circuits included in the dynamic random access memory parts that can have power removed during the self-refresh.

32. The process of claim 31, wherein the reducing the self-refresh rate includes reducing the frequency of an oscillator in the memory part.

33. The process of claim 31, wherein the operating first circuits includes operating a Vbb pump once before and once after, but not during, the refresh of a row of memory cells.

34. The process of claim 31, wherein the removing electrical power includes removing electrical power from the column paths.

35. The process of claim 31, wherein the producing signals includes producing CBR refresh signals with the row address strobe inactive for at least ten microseconds.

* * * * *